(12) United States Patent
Liu et al.

(10) Patent No.: US 10,059,866 B2
(45) Date of Patent: Aug. 28, 2018

(54) EPOXY RESIN COMPOSITIONS AND THERMAL INTERFACE MATERIALS COMPRISING THE SAME

(71) Applicant: INDUSTRIAL TECHNOLOGY RESEARCH INSTITUTE, Hsinchu (TW)

(72) Inventors: Yen-Chun Liu, Taipei (TW); Hui-Wen Chang, Hsinchu (TW); Hsiang-Yen Tsao, New Taipei (TW); Kuo-Chan Chiou, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 200 days.

(21) Appl. No.: 14/974,616

(22) Filed: Dec. 18, 2015

(65) Prior Publication Data

US 2017/0158932 A1 Jun. 8, 2017

(30) Foreign Application Priority Data

Dec. 3, 2015 (TW) .............................. 104140492 A

(51) Int. Cl.
| | |
|---|---|
| C08L 63/00 | (2006.01) |
| C08G 59/24 | (2006.01) |
| C08G 59/50 | (2006.01) |
| C09K 5/14 | (2006.01) |
| C08G 59/22 | (2006.01) |
| H01L 23/373 | (2006.01) |
| C09J 163/00 | (2006.01) |
| B32B 27/38 | (2006.01) |

(52) U.S. Cl.
CPC .............. *C09K 5/14* (2013.01); *C08G 59/22* (2013.01); *C08G 59/226* (2013.01); *C08G 59/24* (2013.01); *C08G 59/245* (2013.01); *C08G 59/50* (2013.01); *C08G 59/5033* (2013.01); *H01L 23/3737* (2013.01)

(58) Field of Classification Search
CPC ....... C08L 63/00; C08G 59/22; C08G 59/226; C08G 59/24; C08G 59/26; C08G 59/50; C08G 59/5033
USPC .................................................. 523/427, 428
See application file for complete search history.

(56) References Cited

U.S. PATENT DOCUMENTS

| | | | |
|---|---|---|---|
| 5,322,864 A | 6/1994 | Sugimoto et al. | |
| 5,360,837 A * | 11/1994 | Honda ................. | C08G 59/226 257/E23.119 |
| 6,838,176 B2 | 1/2005 | Goto et al. | |
| 7,109,288 B2 | 9/2006 | Akatsuka et al. | |
| 8,153,229 B2 | 4/2012 | Kousaka et al. | |
| 2002/0132873 A1* | 9/2002 | Papathomas ........... | H05K 3/284 522/66 |
| 2004/0224163 A1 | 11/2004 | Tobita et al. | |
| 2009/0166897 A1* | 7/2009 | Katsurayama ......... | C08G 59/18 257/793 |
| 2013/0203882 A1* | 8/2013 | Cherkaoui .............. | C08L 83/06 522/31 |
| 2015/0017450 A1 | 1/2015 | Oka et al. | |

FOREIGN PATENT DOCUMENTS

| | | |
|---|---|---|
| CN | 1388818 A | 1/2003 |
| CN | 103964747 A | 8/2014 |
| CN | 104105756 A | 10/2014 |
| JP | 2013-18928 A | 1/2013 |
| TW | 200720313 | 6/2007 |
| TW | 201226468 A1 | 7/2012 |
| WO | WO 2007/129662 A1 | 11/2007 |
| WO | WO 2009/031536 A1 | 3/2009 |

OTHER PUBLICATIONS

Farren et al., "Thermal and mechanical properties of liquid crystalline epoxy resins as a function of mesogen concentration", Elsevier, Polymer, 2001, vol. 42, pp. 1507-1514.
Harada et al., "Thermal conductivity of liquid crystalline epoxy/BN filler composites having ordered network structure", Elsevier, Composites: Part B, 2013, vol. 55, pp. 306-313.
Lee et al., "The effect of mesogenic length on the curing behavior and properties of liquid crystalline epoxy resins", Elsevier, Polymer, 2006, vol. 47, pp. 3036-3042.
Li et al., "Liquid crystalline epoxy resin based on biphenyl mesogen: Effect of magnetic field orientation during cure", Elsevier, Polymer, 2013, vol. 54, pp. 5741-5746.
Li et al., "Liquid crystalline epoxy resin based on biphenyl mesogen: Thermal characterization", Elsevier, Polymer, 2013, vol. 54, pp. 3017-3025.
Taiwanese Office Action and Search Report, dated Jun. 23, 2016, for Taiwanese Application No. 104140492.
European Search Report for Appl. No. 16192675.3 dated Apr. 24, 2017.
Guo, H., et al, "High thermal conductivity epoxies containing substituted biphenyl mesogenic," J. Mater. Sci., 2016, vol. 27, No. 3, pp. 2754-2759.

(Continued)

*Primary Examiner* — Michael J Feely

(74) *Attorney, Agent, or Firm* — Birch, Stewart, Kolasch & Birch, LLP

(57) ABSTRACT

An epoxy resin composition is provided. The epoxy resin composition includes a first aromatic epoxy resin represented by formula (I), and an amino compound selected from a group that includes 4,4'-methylenedianiline, 4,4'-ethylenedianiline, 4,4'-bis(4-aminophenoxy)biphenyl and 1,4-bis(4-aminophenoxy)benzene, wherein the ratio between the epoxy groups of the first aromatic epoxy resin and the amino groups of the amino compound ranges from 1:1 to 2:1.

8 Claims, No Drawings

(56) References Cited

OTHER PUBLICATIONS

Japanese Office Action for Japanese Application No. 2016-235117, dated Sep. 26, 2017, with a partial English translation.

* cited by examiner

EPOXY RESIN COMPOSITIONS AND THERMAL INTERFACE MATERIALS COMPRISING THE SAME

CROSS REFERENCE TO RELATED APPLICATIONS

This application claims the priority of Taiwan Patent Application No. 104140492, filed on Dec. 3, 2015, the entirety of which is incorporated by reference herein.

TECHNICAL FIELD

The technical field relates to an epoxy resin composition and a thermal interface material comprising the same.

BACKGROUND

In order to improve the design of electronic products to have multi-function, high-speed and high-power, a thermal interface material plays a key role in thermal management design. How to increase thermal conductivity efficiency between elements and heat sinks, the characteristics of thermal conductivity and thermal resistance of the thermal interface material play an important role.

The resin composition of the current thermal interface material is mostly epoxy resin, siloxane resin and polyamide resin, and high-thermal-conductive powder capable of improving thermal conductivity, for example ceramic powder such as aluminum oxide or boron nitride is added thereto, and then made into the form of flakes, gaskets, ribbon or film. In order to improve the thermal conductivity value of the thermal interface material, the amount of thermally conductive powder that is added is usually greater than 80 wt % based on the total composition. As more thermally conductive powder is added, the thermal conductivity value gets higher. However, in this situation, it is often difficult to exhibit the of the resin composition, resulting in deteriorated characteristics such as softness, mechanical strength etc.

Accordingly, there is a need for a novel resin composition to meet the requirements of high thermal conductivity and mechanical property.

SUMMARY

One embodiment of the disclosure provides an epoxy resin composition, The composition includes a first aromatic epoxy resin and an amino compound, wherein the ratio between the epoxy groups of the first aromatic epoxy resin and the amino groups of the amino compound ranges from 1:1 to 2:1. The first aromatic epoxy resin is represented by the following formula (I), and the amino compound is selected from the group consisting of 4,4'-methylenedianiline (MDA), 4,4'-ethylenedianiline (EDA), 4,4'-bis(4-aminophenoxy)biphenyl (BAPB) and 1,4-bis(4-aminophenoxy)benzene.

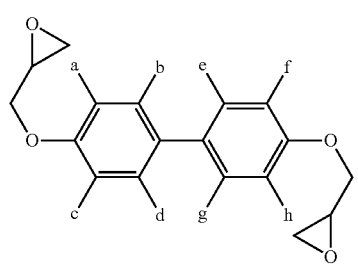

(I)

In formula (I), a-h are independently hydrogen or methyl.

One embodiment of the disclosure provides a thermal interface material. The thermal interface material includes the aforementioned epoxy resin composition and a thermal conductive filler.

A detailed description is given in the following embodiments.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

In accordance with one embodiment of the disclosure, an epoxy resin composition is provided. The epoxy resin composition comprises a first aromatic epoxy resin represented by the following formula (I) and an amino compound selected from the group consisting of the following formulae (II), (III), (IV) and (V).

In this embodiment, the ratio between the epoxy groups of the first aromatic epoxy resin and the amino groups of the amino compound may range from about 1:1 to 2:1.

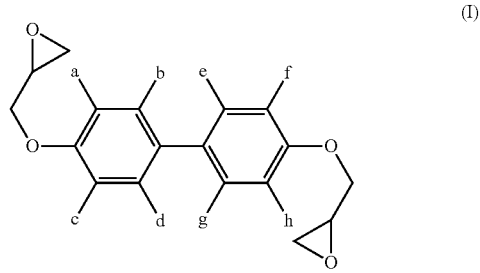

(I)

In formula (I), a-h may, independently, be hydrogen or methyl.

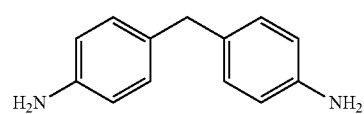

(II)

4,4'-methylenedianiline (MDA)

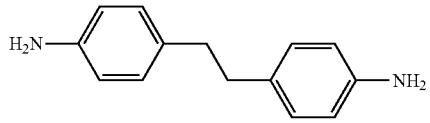

(III)

4,4'-ethylenedianiline (EDA)

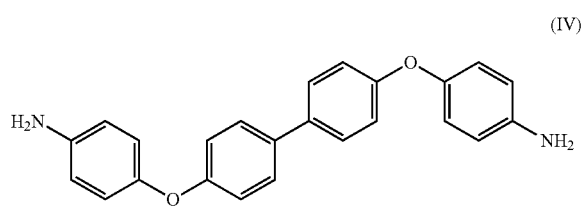 [SMILES: Nc1ccc(Oc2ccc(-c3ccc(Oc4ccc(N)cc4)cc3)cc2)cc1]

4,4'-bis(4-aminophenoxy)biphenyl (BAPB)

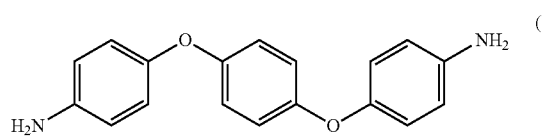

1,4-bis(4-aminophenoxy)benzene

In one embodiment, the first aromatic epoxy resin may be selected from the group consisting of

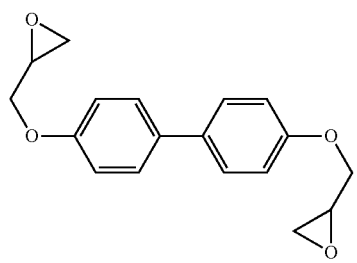 [SMILES: c1cc(-c2ccc(OCC3CO3)cc2)ccc1OCC1CO1]

(4,4'-bis(2,3-epoxypropoxy)biphenyl, BEPB) and

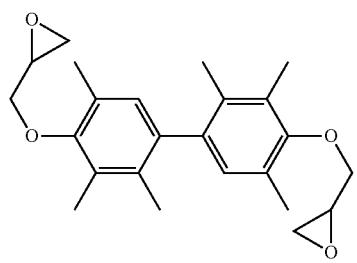 [SMILES: Cc1cc(-c2cc(C)c(OCC3CO3)c(C)c2C)c(C)c(C)c1OCC1CO1]

(4,4'-bis(2,3-epoxypropoxy)-2,2',3,3',5,5'-hexamethylbiphenyl, BEPHMB).

In accordance with one embodiment of the disclosure, an epoxy resin composition is provided. The epoxy resin composition includes a first aromatic epoxy resin, a second aromatic epoxy resin and an amino compound. The first aromatic epoxy resin is represented by the following formula (I), and the amino compound is selected from the group consisting of 4,4'-methylenedianiline (MDA), 4,4'-ethylenedianiline (EDA), 4,4'-bis(4-aminophenoxy)biphenyl (BAPB) and 1,4-bis(4-aminophenoxy)benzene.

In this embodiment, the ratio between the epoxy groups of the first aromatic epoxy resin and the second aromatic epoxy resin and the amino groups of the amino compound may range from about 1:1 to 2:1. Additionally, the ratio between the first aromatic epoxy resin and the second aromatic epoxy resin may range from about 70:30-90:10.

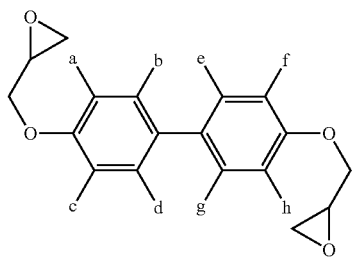

(I)

In formula (I), a-h may, independently, be hydrogen or methyl.

In one embodiment, the first aromatic epoxy resin may be selected from the group consisting of 4,4'-bis(2,3-epoxypropoxy)biphenyl (BEPB) and 4,4'-bis(2,3-epoxypropoxy)-2,2',3,3',5,5'-hexamethylbiphenyl (BEPHMB).

In one embodiment, the second aromatic epoxy resin may be represented by the following formula:

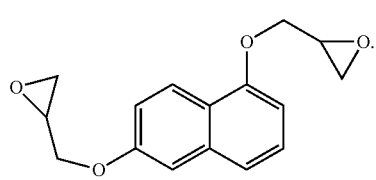

(4032)

In accordance with one embodiment of the disclosure, an epoxy resin composition is provided. The epoxy resin composition includes a first aromatic epoxy resin, an alicyclic epoxy resin and an amino compound. The first aromatic epoxy resin is represented by the following formula (I), and the amino compound is selected from the group consisting of 4,4'-methylenedianiline (MDA), 4,4'-ethylenedianiline (EDA), 4,4'-bis(4-aminophenoxy)biphenyl (BAPB) and 1,4-bis(4-aminophenoxy)benzene.

In this embodiment, the ratio between the epoxy groups of the first aromatic epoxy resin and the alicyclic epoxy resin and the amino groups of the amino compound may range from about 1:1 to 2:1. Additionally, the ratio between the first aromatic epoxy resin and the alicyclic epoxy resin may range from about 60:40-100:0 or 62:38-89:11.

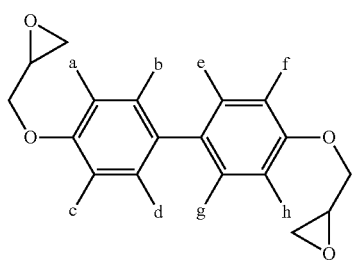

(I)

In formula (I), a-h may, independently, be hydrogen or methyl.

In one embodiment, the first aromatic epoxy resin may be selected from the group consisting of 4,4'-bis(2,3-epoxypropoxy)biphenyl (BEPB) and 4,4'-bis(2,3-epoxypropoxy)-2,2',3,3',5,5'-hexamethylbiphenyl (BEPHMB).

In one embodiment, the alicyclic epoxy resin may be selected from the group consisting of

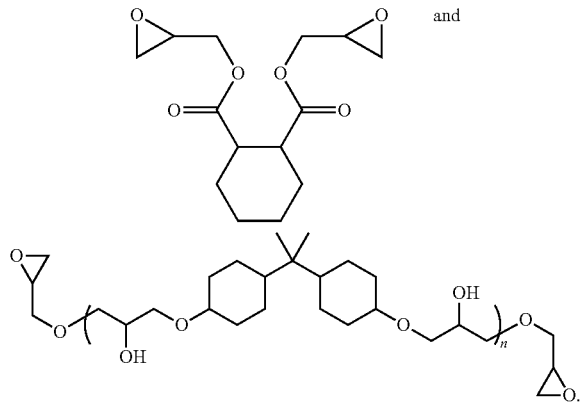

In accordance with one embodiment of the disclosure, an epoxy resin composition is provided. The epoxy resin composition includes a first aromatic epoxy resin, a second aromatic epoxy resin, an alicyclic epoxy resin and an amino compound. The first aromatic epoxy resin is represented by the following formula (I), and the amino compound selected from the group consisting of 4,4'-methylenedianiline (MDA), 4,4'-ethylenedianiline (EDA), 4,4'-bis(4-aminophenoxy)biphenyl (BAPB) and 1,4-bis(4-aminophenoxy)benzene.

In this embodiment, the ratio between the epoxy groups of the first aromatic epoxy resin, the second aromatic epoxy resin and the alicyclic epoxy resin and the amino groups of the amino compound may range from about 1:1 to 2:1. Additionally, the ratio between the aromatic epoxy groups and the alicyclic epoxy groups of the first aromatic epoxy resin, the second aromatic epoxy resin and the alicyclic epoxy resin may range from about 70:30-100:0 or 70:30-90:10.

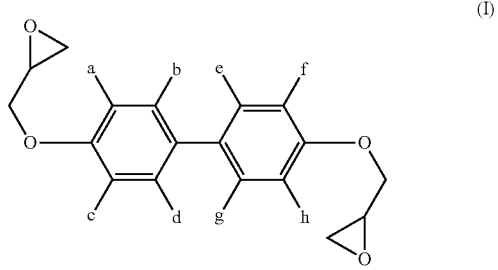
(I)

In formula (I), a-h may, independently, be hydrogen or methyl.

In one embodiment, the first aromatic epoxy resin may be selected from the group consisting of 4,4'-bis(2,3-epoxypropoxy)biphenyl (BEPB) or 4,4'-bis(2,3-epoxypropoxy)-2,2',3,3',5,5'-hexamethylbiphenyl (BEPHMB).

In one embodiment, the second aromatic epoxy resin may be represented by the following formula:

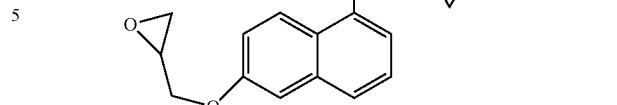
(4032)

In one embodiment, the alicyclic epoxy resin may be selected from the group consisting of

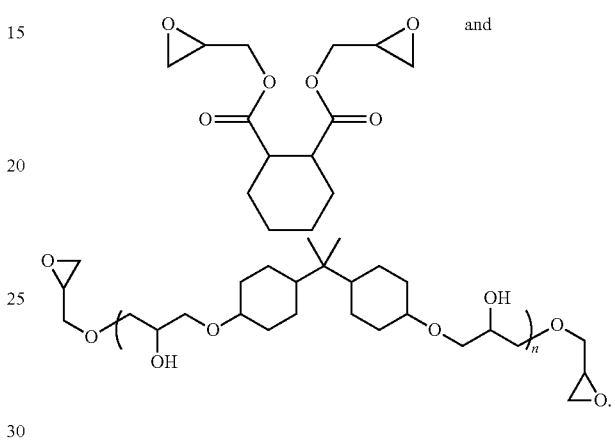

In accordance with one embodiment of the disclosure, a thermal interface material is provided. The thermal interface material comprises an epoxy resin composition and a thermal conductive filler.

In one embodiment, the epoxy resin composition may include a first aromatic epoxy resin and an amino compound. The first aromatic epoxy resin is represented by the following formula (I) and an amino compound is selected from the group consisting of 4,4'-methylenedianiline (MDA), 4,4'-ethylenedianiline (EDA), 4,4'-bis(4-aminophenoxy)biphenyl (BAPB) and 1,4-bis(4-aminophenoxy)benzene.

In this embodiment, the ratio between the epoxy groups of the first aromatic epoxy resin and the amino groups of the amino compound may range from about 1:1 to 2:1.

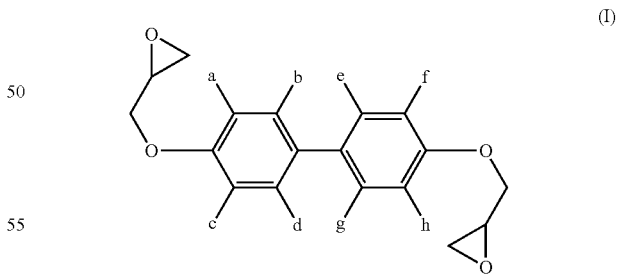
(I)

In formula (I), a-h may, independently, be hydrogen or methyl.

In one embodiment, the first aromatic epoxy resin may be selected from the group consisting of 4,4'-bis(2,3-epoxypropoxy)biphenyl (BEPB) and 4,4'-bis(2,3-epoxypropoxy)-2,2',3,3',5,5'-hexamethylbiphenyl (BEPHMB).

In one embodiment, the epoxy resin composition may include a first aromatic epoxy resin, a second aromatic epoxy resin and an amino compound. The first aromatic epoxy resin is represented by the following formula (I), and the amino compound is selected from the group consisting of 4,4'-methylenedianiline (MDA), 4,4'-ethylenedianiline (EDA), 4,4'-bis(4-aminophenoxy)biphenyl (BAPB) and 1,4-bis(4-aminophenoxy)benzene.

In this embodiment, the ratio between the epoxy groups of the first aromatic epoxy resin and the second aromatic epoxy resin and the amino groups of the amino compound may range from about 1:1 to 2:1. Additionally, the ratio between the first aromatic epoxy resin and the second aromatic epoxy resin may range from about 70:30-90:10.

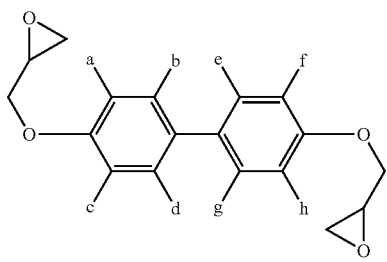

(I)

In formula (I), a-h may, independently, be hydrogen or methyl.

In one embodiment, the first aromatic epoxy resin may be selected from the group consisting of 4,4'-bis(2,3-epoxypropoxy)biphenyl (BEPB) or 4,4'-bis(2,3-epoxypropoxy)-2,2',3,3',5,5'-hexamethylbiphenyl (BEPHMB).

In one embodiment, the second aromatic epoxy resin may be represented by the following formula:

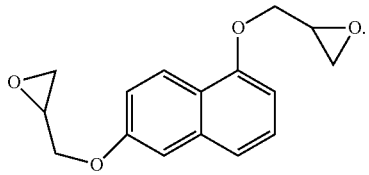

(4032)

In one embodiment, the epoxy resin composition may include a first aromatic epoxy resin, an alicyclic epoxy resin and an amino compound. The first aromatic epoxy resin is represented by the following formula (I), and the amino compound selected from the group consisting of 4,4'-methylenedianiline (MDA), 4,4'-ethylenedianiline (EDA), 4,4'-bis(4-aminophenoxy)biphenyl (BAPB) and 1,4-bis(4-aminophenoxy)benzene.

In this embodiment, the ratio between the epoxy groups of the first aromatic epoxy resin and the alicyclic epoxy resin and the amino groups of the amino compound may range from about 1:1 to 2:1. Additionally, the ratio between the first aromatic epoxy resin and the alicyclic epoxy resin may range from about 60:40-100:0.

In one embodiment, the ratio between the first aromatic epoxy resin and the alicyclic epoxy resin may range from about 62:38-89:11.

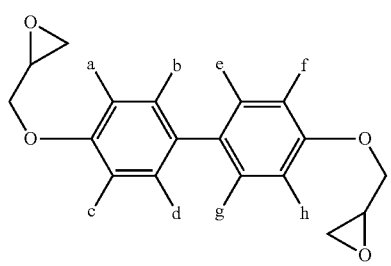

(I)

In formula (I), a-h may, independently, be hydrogen or methyl.

In one embodiment, the first aromatic epoxy resin may be selected from the group consisting of 4,4'-bis(2,3-epoxypropoxy)biphenyl (BEPB) or 4,4'-bis(2,3-epoxypropoxy)-2,2',3,3',5,5'-hexamethylbiphenyl (BEPHMB).

In one embodiment, the alicyclic epoxy resin may be selected from the group consisting of

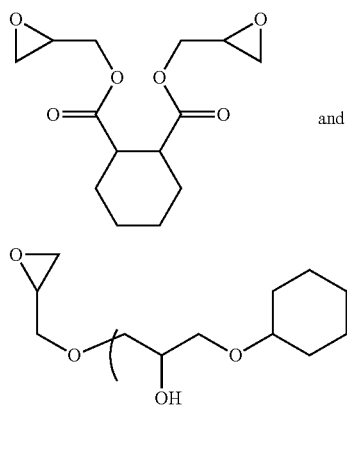

and

In one embodiment, the epoxy resin composition may include a first aromatic epoxy resin, a second aromatic epoxy resin, an alicyclic epoxy resin and an amino compound. The first aromatic epoxy resin is represented by the following formula (I), and the amino compound is selected from the group consisting of 4,4'-methylenedianiline (MDA), 4,4'-ethylenedianiline (EDA), 4,4'-bis(4-aminophenoxy)biphenyl (BAPB) and 1,4-bis(4-aminophenoxy)benzene.

In this embodiment, the ratio between the epoxy groups of the first aromatic epoxy resin, the second aromatic epoxy resin and the alicyclic epoxy resin and the amino groups of the amino compound may range from about 1:1 to 2:1. Additionally, the ratio between the aromatic epoxy groups and the alicyclic epoxy groups of the first aromatic epoxy resin, the second aromatic epoxy resin and the alicyclic epoxy resin may range from about 70:30-100:0.

In one embodiment, the ratio between the aromatic epoxy groups and the alicyclic epoxy groups of the first aromatic epoxy resin, the second aromatic epoxy resin and the alicyclic epoxy resin may range from about 70:30-90:10.

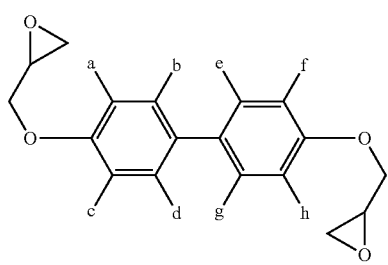

(I)

In formula (I), a-h may, independently, be hydrogen or methyl.

In one embodiment, the first aromatic epoxy resin may be selected from the group consisting of 4,4'-bis(2,3-epoxypropoxy)biphenyl (BEPB) or 4,4'-bis(2,3-epoxypropoxy)-2,2',3,3',5,5'-hexamethylbiphenyl (BEPHMB).

In one embodiment, the second aromatic epoxy resin may be represented by the following formula:

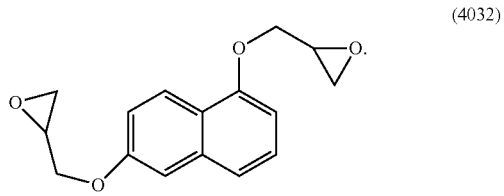 [SMILES: c1cc(OCC2CO2)c2ccc(OCC3CO3)cc2c1]

(4032)

In one embodiment, the alicyclic epoxy resin may be selected from the group consisting of

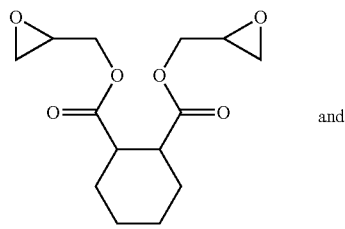

and

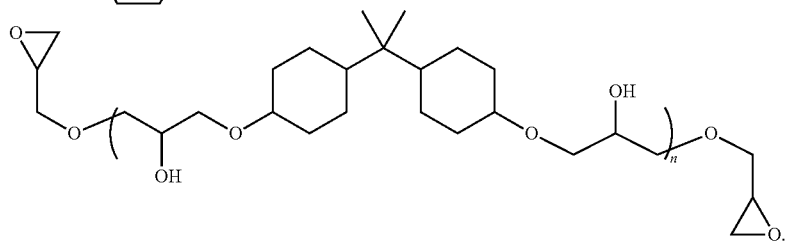

In some embodiments, the thermal conductive filler added in the epoxy resin composition may be selected from the group consisting of copper, gold, nickel, silver, aluminum, boron nitride, aluminum oxide, aluminum nitride, magnesium oxide, zinc oxide, silicon carbide, beryllium oxide, diamond, graphite sheet, tungsten carbide, carbon fiber, carbon nanotube or a mixture thereof, with a weight ratio less than or equal to about 50%.

In the disclosure, a cured epoxy resin composition is developed adopting a specific molecular structure design. An aromatic epoxy resin (for example, BEPB, BEPHMB or 4032), an alicyclic epoxy resin (for example, 5200 or 5000) and an amino compound with the specific structure (for example, 4,4'-methylenedianiline (MDA), 4,4'-ethylenedianiline (EDA), 4,4'-bis(4-aminophenoxy)biphenyl (BAPB) or 1,4-bis(4-aminophenoxy)benzene) are conducted to improve the arrangement of the microstructure of an epoxy resin. Therefore, an epoxy resin with high thermal conductivity (0.3 W/mK above) and insulating property is developed.

EXAMPLES

Example 1

The Preparation of the Thermal Interface Material (1)

After 2.12 g of epoxy resin BEPB was completely dissolved in 2.68 g of DMAc, 0.91 g of epoxy resin 4032 and 0.99 g of MDA were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 1.

Example 2

The Preparation of the Thermal Interface Material (2)

After 2.68 g of epoxy resin BEPHMB was completely dissolved in 3.05 g of DMAc, 0.91 g of epoxy resin 4032 and 0.99 g of MDA were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 1.

Example 3

The Preparation of the Thermal Interface Material (3)

After 1.51 g of epoxy resin BEPB was completely dissolved in 2.95 g of DMAc, 1.32 g of epoxy resin 5000, 0.6 g of epoxy resin 4032 and 0.99 g of MDA were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 1.

Example 4

The Preparation of the Thermal Interface Material (4)

After 1.91 g of epoxy resin BEPHMB was completely dissolved in 3.22 g of DMAc, 1.32 g of epoxy resin 5000, 0.6 g of epoxy resin 4032 and 0.99 g of MDA were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 1.

TABLE 1

| | Example 1 | Example 2 | Example 3 | Example 4 |
|---|---|---|---|---|
| Epoxy resin | 4032/BEPB (3:7) | 4032/BEPHMB (3:7) | 5000/4032/BEPB (3:2:5) | 5000/4032/BEPHMB (3:2:5) |
| Amine curing agent | MDA | MDA | MDA | MDA |
| Thermal conductivity value (W/mK) | 0.35 | 0.33 | 0.32 | 0.30 |
| Volume resistivity (Ω-cm) | $10^{13}$ | $10^{13}$ | $10^{15}$ | $10^{15}$ |

TABLE 1-continued

| | Example 1 | Example 2 | Example 3 | Example 4 |
|---|---|---|---|---|
| Breakdown voltage (KV/mil) | 1.7 | 1.6 | 1.7 | 1.7 |

Example 5

The Preparation of the Thermal Interface Material (5)

After 2.12 g of epoxy resin BEPB was completely dissolved in 2.86 g of DMAc, 0.88 g of epoxy resin 5000, 0.3 g of epoxy resin 4032 and 0.99 g of MDA were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 2.

Example 6

The Preparation of the Thermal Interface Material (6)

After 2.41 g of epoxy resin BEPB was completely dissolved in 2.77 g of DMAc, 0.44 g of epoxy resin 5000, 0.3 g of epoxy resin 4032 and 0.99 g of MDA were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 2.

Example 7

The Preparation of the Thermal Interface Material (7)

After 3.06 g of epoxy resin BEPHMB was completely dissolved in 3.20 g of DMAc, 0.44 g of epoxy resin 5000, 0.3 g of epoxy resin 4032 and 0.99 g of MDA were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 2.

Example 8

The Preparation of the Thermal Interface Material (8)

After 2.42 g of epoxy resin BEPB was completely dissolved in 2.82 g of DMAc, 0.44 g of epoxy resin 5000, 0.3 g of epoxy resin 4032 and 1.06 g of EDA were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 2.

TABLE 2

|  | Example 5 | Example 6 | Example 7 | Example 8 |
|---|---|---|---|---|
| Epoxy resin | 5000/4032/ BEPB (2:1:7) | 5000/4032/ BEPB (1:1:8) | 5000/4032/ BEPHMB (1:1:8) | 5000/4032/ BEPB (1:1:8) |
| Amine curing agent | MDA | MDA | MDA | EDA |
| Thermal conductivity value (W/mK) | 0.33 | 0.36 | 0.34 | 0.38 |
| Volume resistivity (Ω-cm) | $10^{16}$ | $10^{15}$ | $10^{15}$ | $10^{15}$ |
| Breakdown voltage (KV/mil) | 1.8 | 1.7 | 1.7 | 1.6 |

Example 9

The Preparation of the Thermal Interface Material (9)

After 2.42 g of epoxy resin BEPB was completely dissolved in 3.08 g of DMAc, 0.44 g of epoxy resin 5000, 0.3 g of epoxy resin 4032 and 1.46 g of BAPB were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 3.

Example 10

The Preparation of the Thermal Interface Material (10)

After 2.42 g of epoxy resin BEPB was completely dissolved in 3.33 g of DMAc, 0.44 g of epoxy resin 5000, 0.3 g of epoxy resin 4032 and 1.84 g of BAPBz were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 3.

Example 11

The Preparation of the Thermal Interface Material (11)

After 3.06 g of epoxy resin BEPHMB was completely dissolved in 3.76 g of DMAc, 0.44 g of epoxy resin 5000, 0.3 g of epoxy resin 4032 and 1.84 g of BAPB were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 3.

TABLE 3

|  | Example 9 | Example 10 | Example 11 |
|---|---|---|---|
| Epoxy resin | 5000/4032/ BEPB (1:1:8) | 5000/4032/ BEPB (1:1:8) | 5000/4032/ BEPHMB (1:1:8) |
| Amine curing agent | BAPB | BAPBz | BAPB |
| Thermal conductivity value (W/mK) | 0.45 | 0.34 | 0.42 |
| Volume resistivity (Ω-cm) | $10^{15}$ | $10^{15}$ | $10^{15}$ |
| Breakdown voltage (KV/mil) | 1.7 | 1.7 | 1.7 |

Comparative Example 1

The Preparation of the Thermal Interface Material (1)

After 1.81 g of epoxy resin 4032 was completely dissolved in 3.041 g of DMAc, 1.76 g of epoxy resin 5000 and 0.99 g of MDA were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 4.

Comparative Example 2

The Preparation of the Thermal Interface Material (2)

After 1.81 g of epoxy resin 4032 was completely dissolved in 2.78 g of DMAc, 1.36 g of epoxy resin 5200 and 0.99 g of MDA were added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 4.

Comparative Example 3

The Preparation of the Thermal Interface Material (3)

After 3.77 g of epoxy resin 828

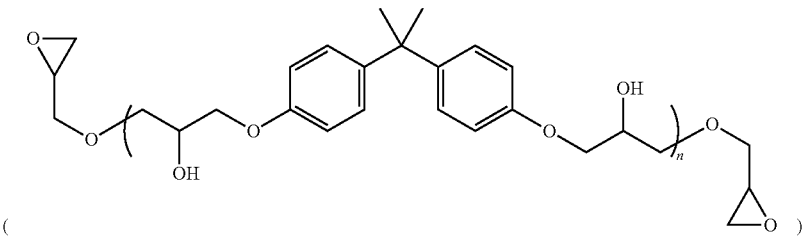

was completely dissolved in 3.34 g of DMAc, 1.24 g of 4,4'-diaminodiphenyl sulfone

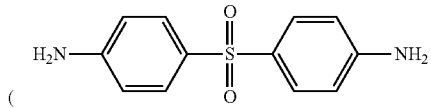

was added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 4.

Comparative Example 4

The Preparation of the Thermal Interface Material (4)

After 3.77 g of epoxy resin 828 was completely dissolved in 3.17 g of DMAc, 0.99 g of MDA was added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained. Some physical properties, for example thermal conductivity value, volume resistivity and breakdown voltage, of the thermal interface material were tested and are listed in Table 4.

Comparative Example 5

The Preparation of the Thermal Interface Material (5)

After 3.02 g of epoxy resin BEPB was completely dissolved in 2.84 g of DMAc, 1.24 g of 4,4'-diaminodiphenyl sulfone was added to form a solution. After the solution was uniformly stirred and mixed, 6 g of the solution was taken out and placed on an aluminum pan and in an oven with 120° C. for two hours. After curing, the oven was adjusted to 170° C. After baking for 40 minutes, solvent was removed from the solution. A thermal interface material was obtained.

Some physical properties, for example thermal conductivity value, volume resistivity and breakdown voltage, of the thermal interface material were tested and are listed in Table 4.

TABLE 4

|  | Com. Example 1 | Com. Example 2 | Com. Example 3 | Com. Example 4 | Com. Example 5 |
|---|---|---|---|---|---|
| Epoxy resin | 5000/4032 (4:6) | 5000/4032 (4:6) | 828 | 828 | BEPB |
| Amine curing agent | MDA | MDA | DDS | MDA | DDS |
| Thermal conductivity value (W/mK) | 0.22 | 0.23 | 0.18 | 0.24 | 0.26 |
| Volume resistivity (Ω-cm) | $10^{17}$ | $10^{17}$ | $10^{17}$ | $10^{17}$ | $10^{17}$ |
| Breakdown voltage (KV/mil) | 1.9 | 1.9 | 1.7 | 1.5 | 1.7 |

Example 12

The Preparation of the Thermal Interface Material (12)

After 0.3 g of epoxy resin 4032 and 2.42 g of epoxy resin BEPB were completely dissolved in 3.33 g of DMAc, 0.44 g of epoxy resin 5000 and 1.84 g of BAPB were added to form a solution. After the solution was uniformly stirred and mixed, 6 g of the solution was taken out and mixed with 6 g of aluminum oxide (Al$_2$O$_3$) by a mixer. The solution was placed in an oven with 120° C. for two hours. After curing, the oven was adjusted to 170° C. After baking for 40 minutes, solvent was removed from the solution. A thermal interface material with a solid content of about 50 wt % was obtained. Some physical properties, for example thermal conductivity value, volume resistivity and breakdown voltage, of the thermal interface material were then tested and are listed in Table 5.

Example 13

The Preparation of the Thermal Interface Material (13)

After 0.3 g of epoxy resin 4032 and 3.06 g of epoxy resin BEPHMB were completely dissolved in 3.76 g of DMAc, 0.44 g of epoxy resin 5000 and 1.84 g of BAPB were added to form a solution. After the solution was uniformly stirred and mixed, 6 g of the solution was taken out and mixed with 6 g of aluminum oxide (Al$_2$O$_3$) by a mixer. The solution was placed in an oven with 120° C. for two hours. After curing, the oven was adjusted to 170° C. After baking for 40 minutes, solvent was removed from the solution. A thermal interface material with a solid content of about 50 wt % was obtained. Some physical properties, for example thermal conductivity value, volume resistivity and breakdown voltage, of the thermal interface material were then tested and are listed in Table 5.

Comparative Example 6

The Preparation of the Thermal Interface Material (6)

After 3.77 g of epoxy resin 828 was completely dissolved in 3.34 g of DMAc, 1.24 g of 4,4'-diaminodiphenyl sulfone was added to form a solution. After the solution was uniformly stirred and mixed, 6 g of the solution was taken out and mixed with 34 g of aluminum oxide (Al$_2$O$_3$) by a mixer. The solution was placed in an oven with 120° C. for two hours. After curing, the oven was adjusted to 170° C. After baking for 40 minutes, solvent was removed from the solution. A thermal interface material with a solid content of about 85 wt % was obtained. Some physical properties, for example thermal conductivity value, volume resistivity and breakdown voltage, of the thermal interface material were then tested and are listed in Table 5.

TABLE 5

| | Example 12 | Example 13 | Com. Example 6 |
|---|---|---|---|
| Epoxy resin | 5000/4032/ BEPB | 5000/4032/ BEPHMB | 828 |
| Amine curing agent | BAPB | BAPB | DDS |
| Thermally conductive powder | Al$_2$O$_3$ (50%) | Al$_2$O$_3$ (50%) | Al$_2$O$_3$ (85%) |
| Thermal conductivity value (W/mK) | 5.0 | 4.5 | 3.2 |
| Volume resistivity (Ω-cm) | 10$^{13}$ | 10$^{13}$ | 10$^{11}$ |
| Breakdown voltage (KV/mil) | 1.5 | 1.5 | 1.1 |

It will be apparent to those skilled in the art that various modifications and variations can be made to the disclosed embodiments. It is intended that the specification and examples be considered as exemplary only, with the true scope of the disclosure being indicated by the following claims and their equivalents.

What is claimed is:

1. An epoxy resin composition, comprising:
a first aromatic epoxy resin represented by formula (I):

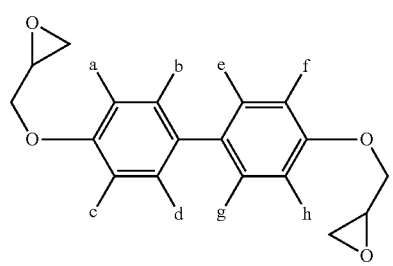

(I)

wherein a-h are independently hydrogen or methyl;
a second aromatic epoxy resin represented by the following formula:

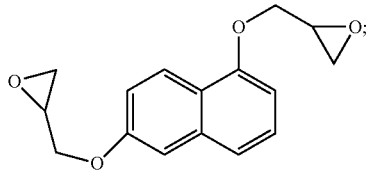 [SMILES: c1cc(OCC2CO2)c2ccc(OCC3CO3)cc2c1]

an alicyclic epoxy resin of diglycidyl ether of hydrogenated bisphenol A; and
an amino compound selected from the group consisting of 4,4'-ethylenedianiline (EDA), 4,4'-bis(4-aminophenoxy)biphenyl (BAPB) and 1,4-bis(4-aminophenoxy)benzene, wherein the ratio between the epoxy groups of the first aromatic epoxy resin, the second aromatic epoxy resin and the alicyclic epoxy resin and the amino groups of the amino compound ranges from 1:1 to 2:1.

2. The epoxy resin composition as claimed in claim 1, wherein the first aromatic epoxy resin is selected from the group consisting of

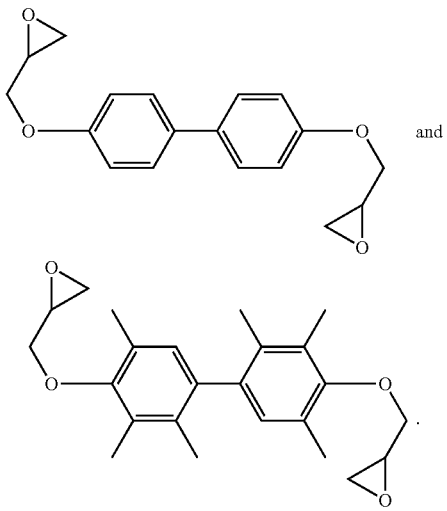

3. The epoxy resin composition as claimed in claim 1, wherein the ratio between the first aromatic epoxy resin and the second aromatic epoxy resin ranges from 70:30-90:10.

4. The epoxy resin composition as claimed in claim 1, wherein the weight ratio between the first aromatic epoxy resin and the alicyclic epoxy resin ranges from 62:38-89:11.

5. The epoxy resin composition as claimed in claim 1, wherein the ratio between the aromatic epoxy groups and the alicyclic epoxy groups of the first aromatic epoxy resin, the second aromatic epoxy resin and the alicyclic epoxy resin ranges from 70:30-90:10.

6. A thermal interface material, comprising:
an epoxy resin composition as claimed in claim 1; and
a thermal conductive filler.

7. The thermal interface material as claimed in claim 6, wherein the thermal conductive filler comprises copper, gold, nickel, silver, aluminum, boron nitride, aluminum oxide, aluminum nitride, magnesium oxide, zinc oxide, silicon carbide, beryllium oxide, diamond, graphite sheet, tungsten carbide, carbon fiber, carbon nanotube or a mixture thereof.

8. The thermal interface material as claimed in claim 6, wherein the thermal conductive filler has a weight ratio of 20-95%.

* * * * *